United States Patent [19]
Bazargan

[11] Patent Number: 5,828,231
[45] Date of Patent: Oct. 27, 1998

[54] HIGH VOLTAGE TOLERANT INPUT/OUTPUT CIRCUIT

[75] Inventor: Hassan K. Bazargan, San Jose, Calif.

[73] Assignee: Xilinx, Inc., San Jose, Calif.

[21] Appl. No.: 700,247

[22] Filed: Aug. 20, 1996

[51] Int. Cl.[6] .............................................. H03K 19/185
[52] U.S. Cl. ............................. 326/81; 326/58; 326/86
[58] Field of Search ................................. 326/80–81, 83, 326/86, 17, 57–58, 121, 68, 27; 327/333; 361/91

[56] References Cited

U.S. PATENT DOCUMENTS

| | | | |
|---|---|---|---|
| 4,963,766 | 10/1990 | Lundberg | 326/81 |
| 5,144,165 | 9/1992 | Dhong et al. | 326/80 |
| 5,543,733 | 8/1996 | Mattos et al. | 326/81 |
| 5,644,265 | 7/1997 | Austin et al. | 327/333 |

OTHER PUBLICATIONS

Altera Corporation, "A 3.3–V Programmable Logic Device that Addresses Low Power Supply and Interface Trends" by Rakesh Patel et al., Custom Integrated Circuits Conference (CICC), Santa Clara, California, May 5–8, 1997.

*Primary Examiner*—Jon Santamauro
*Attorney, Agent, or Firm*—Anthony C. Murabito, Wagner, Murabito & Hao; Jeanette S. Harms

[57] ABSTRACT

A low voltage driver circuit capable of interfacing with a high voltage node. The high voltage tolerant input/output circuit of the present invention has a first stage operating at a low voltage integrated circuit standard and a second stage capable of operating at both the low voltage and a high voltage integrated circuit standard. The second stage operates at high voltage during the tristate mode and at low voltage during an active mode. The second stage uses an output driver having a p-type pull-up transistor coupled to an input/output pad. The input/output pad interfaces with a high voltage or mixed voltage network. An isolator circuit is coupled between the first stage and the second stage for voltage isolation when the second stage is operating at high voltage. A charger circuit maintains the high voltage on a gate of the p-type pull-up transistor during the tristate mode and the low voltage during the active mode. The charger also decreases the voltage on the gate of the p-type pull-up transistor in advance of a transition from the tristate to the active mode. The p-type transistors in the circuit which are exposed to the high voltage have their NWELLs coupled to the high voltage. This configuration prevents the back flow of current from the high voltage network to the second stage and protects the p-type transistors in the circuit from latch up.

18 Claims, 10 Drawing Sheets

OVERVIEW OR SUMMARY

HIGH VOLTAGE TOLERANT INPUT/OUTPUT CIRCUIT

FIELD OF THE INVENTION

The field of the present invention pertains to semiconductor integrated circuit input/output devices. More particularly, the present invention relates to a 5 volt tolerant input/output circuit in a semiconductor integrated circuit.

BACKGROUND OF THE INVENTION

Digital integrated circuits are being used today to perform a wide variety of tasks. Most of the power and usefulness of today's digital integrated circuit (IC) devices can be attributed to the increasing levels of integration. Manufacturers of ICs have found that as the level of integration (e.g. density) increases, overall device performance increases. Increasing density has at least three major benefits. First, it allows more circuits to be packed onto the chip. Second, with the circuits closer together, the time for signals to propagate from one circuit to another is decreased, thereby improving overall circuit switching speed. Third, it allows more freedom in circuit design because some circuits designed for different applications can be integrated into one device, thereby increasing the total capabilities of the integrated circuit.

There are drawbacks, however, to higher circuit density. As the number of circuits integrated onto the chip increases, the amount of power dissipated by the chip correspondingly increases. IC density is often limited by overall chip power dissipation (heat). In order to achieve ever greater levels of performance, IC manufacturers seek to limit the effects of power dissipation. Many manufacturers have developed new product lines of digital ICs that operate at lower voltages. Some current ICs operate at 3 volts instead of the industry standard 5 volts (Transistor-Transistor Level or TTL). The lower operating voltages decrease the power dissipation of the ICs. Currently, there are many low voltage technology (LVT) devices on the IC market. For example, some newer microprocessors of the x86 architecture are 3 volt devices. Some new 16Mbit dynamic random access memory ICs are 3 volt devices. LVT devices are also particularly well suited to battery operated equipment where the power supply is finite. The continued development of LVT promises to increase the use of 3 volt devices and increase their utilization within 5 volt designs.

Although LVT devices have a number of advantages over 5 volt devices, it is very popular to integrate LVT components with 5 volt devices. Many industry standard ICs are still fabricated with the familiar 5 volt technology. For this reason, there exits today many mixed voltage systems. Such systems contain both 3 volt devices and 5 volt devices. Reconciling these differences between devices and accounting for them is the task of system designers. System designers must account for the different characteristics of 3 volt ICs and 5 volt ICs.

The problem is more difficult when there are CMOS 3 volt devices and 5 volt devices on the same circuit board, intermixed with each other. Specifically, there are problems when 5 volt devices and 3 volt devices are coupled via their respective I/O pads. Most 5 volt devices, although designed to accept 0 to 5 volt input levels, nominally accept input signals from 3 volt devices. The output signals of 5 volt devices swing from 0 to 5 volts. In 3 volt devices, the corresponding input signals are designed for voltage swings of only 0 to 3 volts. Some 3 volt devices employ PMOS pull-up transistors on their I/O pads. When the output driver of a 5 volt device is coupled to the same data bus as the output driver of a 3 volt device (e.g. the 5 volt device and the 3 volt device both output data on a system data bus), the devices do not properly interface.

Referring now to FIG. 1A, a portion of an exemplary prior art 3 volt output buffer (e.g., circuitry for driving a single I/O pad) is shown. The I/O pad 100 is used to couple the output buffer 10 to other external devices. When a 5 volt device (not shown) is connected to the I/O pad 100, the voltages at I/O pad 100 swing from 0 to 5 volts as the 5 volt device outputs either a logic 0 or a logic 1 signal. Transistor 101 is a PMOS pull-up transistor coupled between the I/O pad 100 and a voltage source Vdd of 3 volts. In the tristate mode, a voltage of 3 volts is provided on the gate of transistor 101, thereby turning that transistor off, isolating I/O pad 100 from Vdd 102. While in the tristate mode, I/O pad 100 is at a high impedance to other devices (not shown). When the I/O pad 100 receives 5 volts, however, transistor 101 Vgs (voltage between the transistor gate and transistor source) rises above Vt (threshold voltage, approximately −0.6v for a PMOS transistor). This causes a current back flow problem. Current back flow occurs when 5 volts on the I/O pad 100 turns on transistor 101. Current from the output buffer of the 5 volt device (not shown) flows via I/O pad 100, flows via transistor 101, and into voltage source Vdd 102 as the 5 volt device attempts to drive I/O pad 100 to 5v. Vdd 102 sinks this current as it attempts to limit I/O pad to Vdd voltage (3v). Thus, a relatively large current flows from the 5 volt device to Vdd 102 and the voltage at I/O pad 100 rises to a level above Vdd (3v). This back flow current can cause serious damage to both the 3 volt buffer and the 5 volt device (not shown).

A second problem is "latch up" and under current back flow conditions latch up often occurs. FIG. 1B is an exemplary cross section of a PMOS transistor 101. The drain 104, the source 105, and the gate 106 are illustrated sharing the common NWELL 107. Latch up occurs because of the unavoidable existence of parasitic PNP and NPN transistors (symbolically represented by a transistor 103) embedded in the NWELL substrate of CMOS ICs. If triggered into conduction, these parasitic transistors will latch up (i.e., stay on permanently), flow large currents and exceed the CMOS device's maximum voltage ratings, thereby destroying the IC. Transistor 103 can also represent other discrete PMOS transistors on the IC (not shown) electrically sharing the same NWELL. For example, as described above, when gate 106 is at the same voltage as drain 104 (3 volts for an LVT device) no current should flow from source 105 to drain 104. However, when source 105 is at a higher voltage (5v) than gate 106 (3v), and the difference is greater than the threshold voltage Vt (−0.6), a back flow current flows from drain 105 to source 104, thereby pushing the voltage between NWAELL 107 and drain 105 higher than designed limits and triggering latchup. The higher source voltage (5v) also forward biases the pn junction between the source 105 and the NWELL 107 which is at 3v, thereby, turning on the PNP transistor 103 and triggering the latch up condition. In addition, latch up can be triggered by high voltage spikes or ringing at the device I/O pad. Typical prior art devices use various schemes to limit the possibility of latch up. Clamping diodes are often connected externally to protect against such transients. Well regulated power supplies seek to minimize spikes on the Vdd line. Manufacturers of typical prior art ICs additionally advise connecting all unused CMOS I/O pads to ground or voltage source Vdd to reduce the chance that stray voltage transients appear at those I/O pads and trigger the device into the latch up condition. All of these standard precautions, however, are defeated when a 3 volt device output line is deliberately connected to a 5 volt device output line through a system data bus in a "mixed voltage" system.

Thus, a need arises for an input/output circuit structure which allows manufacturers to take advantage of the benefits of LVT circuitry while integrated within a design that also contains 5 volt circuitry. A further need arises for an LVT circuit that is immune from back flow problems when driving a 5 volt node. The present invention provides such advantages.

SUMMARY OF THE INVENTION

The high voltage tolerant input/output circuit of the present invention has a first stage operating at LVT standard 3 volts and a second stage capable of operating at both 3 volts and the prevailing industry standard 5 volts. The second stage operates at high voltage during a tristate mode and at low voltage during an active mode. The second stage uses an output driver having a PMOS pull-up transistor coupled to an input/output pad. The input/output pad interfaces with other elements in a 5 volt or mixed voltage network. An isolator circuit is coupled between the first stage and the second stage for voltage isolation when the second stage is operating at 5 volts. A charger circuit maintains the high voltage on a gate of the PMOS pull-up transistor during the tristate mode. The charger circuit also decreases the voltage on the gate of the PMOS pull-up transistor in advance of a transition from the tristate to the active mode, thereby preventing the back flow of current from the high voltage network to the second stage and protecting other PMOS transistors in the circuit from latch up. The input/output circuit of the present invention allows LVT elements to operate at 3 volts, yet interface properly in a 5 volt or mixed voltage network. LVT elements including the input/output circuit of the present invention function nominally in a 3 volt environment. In a 5 volt, or mixed voltage environment, the LVT elements in accordance with the input/output circuit of the present invention are able to accept the high voltage outputs from industry standard 5 volt elements and are immune to both back flow current problems and latch up problems.

The present invention operates with 3 voltage levels, a low voltage, a medium voltage, and a high voltage. In one embodiment, the low voltage is 0 volts, the medium voltage is 3 volts, and the high voltage is 5 volts. It is appreciated that the high voltage tolerant input/output circuit of the present invention is equally suited to differing values of low, medium, and high voltage. Given this, the circuit of the present invention may be adapted to support a plurality of voltage levels for the low, medium, and high voltages.

DETAILED DESCRIPTION OF THE INVENTION

The present invention is a high voltage tolerant input/output circuit having low voltage operating elements. In the following description, for the purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring aspects of the present invention.

In the present embodiment, the high voltage tolerant input/output circuit of the present invention operates at both 3 volts and 5 volts internally. The input/output (IO) circuit of the present invention allows other circuits (functioning at 3 volts) to seamlessly function with a network of 5 volt circuits (at 5 volts).

Thus an IC may function at 3 volts internally and rely on the high voltage tolerant input/output circuit (IO circuit) of the present invention to communicate with external devices operating at 5 volts. By functioning at 3 volts internally, the IC (containing the high voltage tolerant input/output circuit) limits power dissipation and heat problems present with high levels of integration and switching speed. In a network of 5 volt devices, or in a mixed voltage system containing 5 volt devices, voltage levels on the network swing from 0 to five volts when the 5 volt devices are in the active mode. The IO circuit of the present invention tristates at 5 volts when necessary, thereby allowing the IC including the IO circuit to seamlessly function as an integral part of the network or mixed voltage system. The IO circuit of the present invention eliminates both the latch up problem and the back flow current problem present with prior art LVT circuits operating in 5 volt networks. The following detailed description begins with an overview of the high voltage tolerant IO circuit of the present invention. The detailed description continues with a detailed description of each of the components of the present invention and the transitions between operating modes.

Overview of the present invention

Figure 1A:
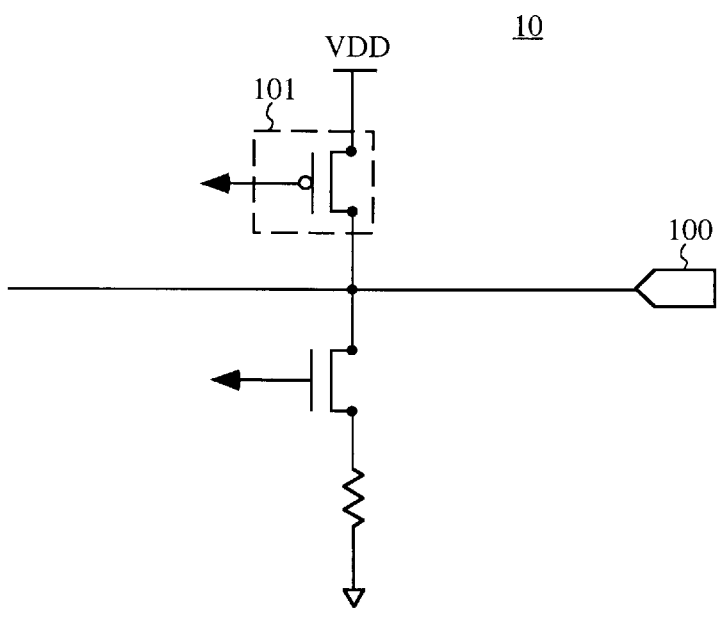
FIG. 1A shows a portion of an I/O buffer of an exemplary 3 volt device of the prior art.
Figure 1B:
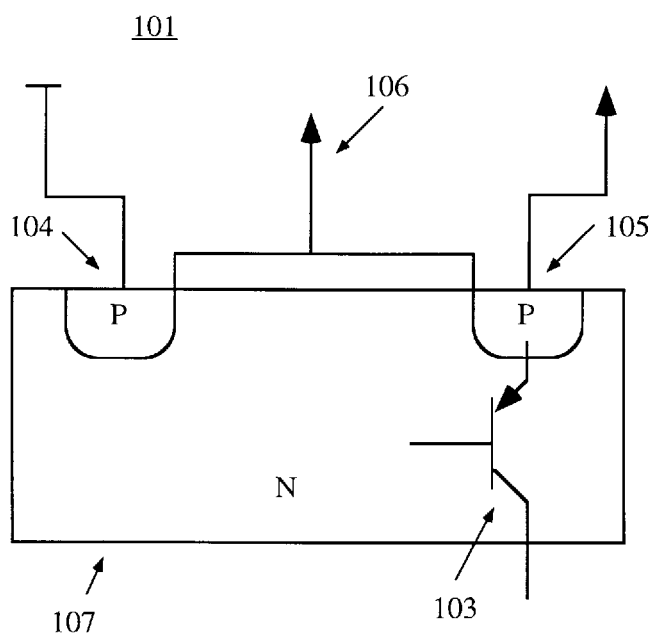
FIG. 1B shows a cross section of the PMOS transistor shown in FIG. 1A.
Figure 2:
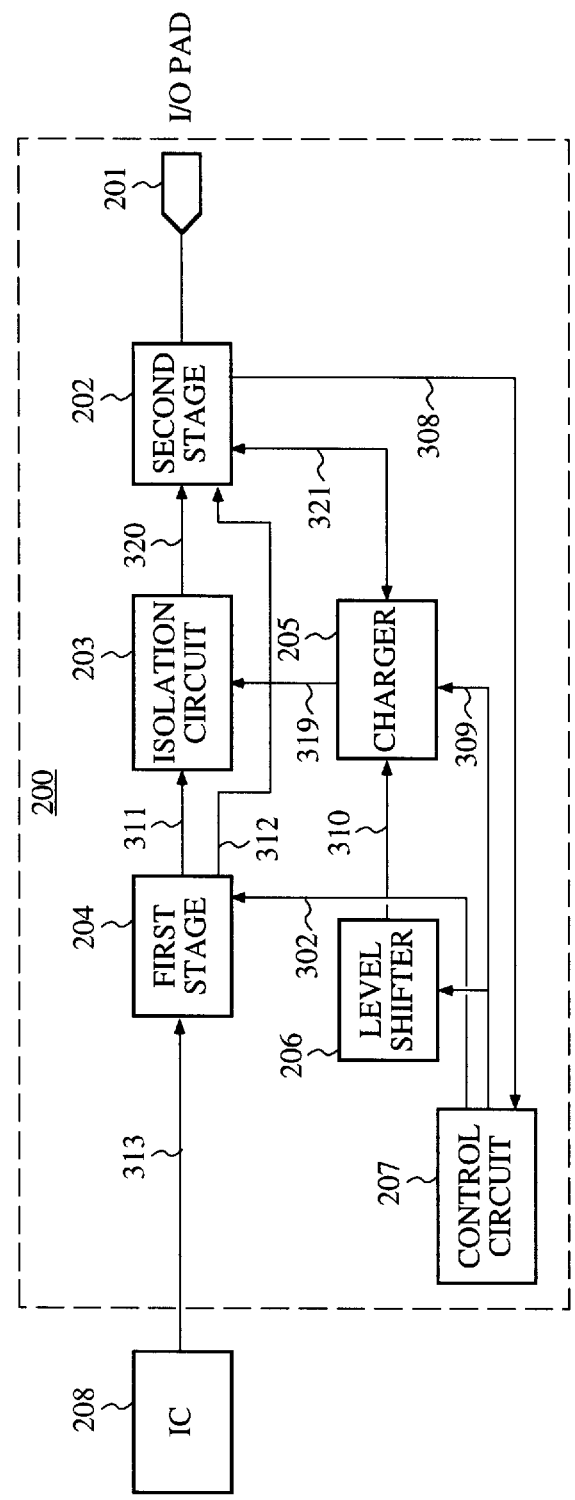
FIG. 2 shows a general block diagram of the high voltage tolerant input/output circuit of the present invention.

FIG. 2 illustrates a block diagram overview of an LVT IC 208 and the components of a high voltage tolerant input/output (IO) circuit 200 in accordance with the present invention. The IO circuit of the present invention operates with three voltage levels, a low voltage, a medium voltage, and a high voltage. In one embodiment, the low voltage is 0 volts, the medium voltage is 3 volts, and the high voltage is 5 volts. It is appreciated that the high voltage tolerant IO circuit of the present invention is equally suited to differing values of low, medium, and high voltages. The LVT IC 208 operates between the medium voltage (3 volts) and the low voltage (0 volts) while performing its logic operations. The LVT IC (hereinafter IC) 208 is not exposed to the high voltage (5 volts). The IC 208 is coupled to a first stage of the present invention via an output data line 313.

The IO circuit of the present invention includes two modes, an active mode, in which the IO circuit 200 is actively outputting data to IO pad 201, and a tristate mode, in which the IO circuit 200 switches IO pad 201 to high impedance. In the active mode, a control circuit 207 configures a level shifter 206, a first stage 204, and a charger 205 to output data from the IC 208 to the IO pad 201, or to isolate the IC 208 from the IO pad 201. The output data line 313 carries the output data signal from the IC 208 to the first stage 204. From the first stage 204, output data signals travel via the isolation circuit 203, to the second stage 202. The second stage 202 drives the output data signals onto the I/O pad 201 for use by elements of a 5 volt network (not shown). The output data signals on I/O pad 201 switch between 0 and 3 volts. The 0 voltage output is nominally read by the 5 volt network as a "logical 0" and the 3 volt output is read as a "logical 1" as is known in the art.

In the tristate mode, the control circuit 207 configures the level shifter 206, first stage 204, and charger 205 to isolate the IO pad 201 from the IC 208, by sending out a transition signal. Upon receiving the transition signal, the level shifter 206 signals the charger 205 to charge the second stage to 5 volts. In turn, the charger 205 charges the isolation circuit 203 to five volts. The isolation circuit 203 isolates the first stage 204 (at 3 volts) from the second stage (now at 5 volts). The second stage then switches the IO pad 201 to the "high z" (i.e., tristate) state. While IO pad 201 is tristated, other devices on the 5 volt network can drive IO pad 201 to 5 volts. The high voltage (5 volts) present in the second stage 202 prevents the current back flow and latch up problems typical of prior art LVT circuits. The high voltage in the charger 205 and level shifter 206, prevent back flow and latch up problems from the high voltage in the second stage 202. The high voltage in the isolation circuit 203 is not present on the output data line 313. The isolation circuit 203 effectively isolates the IC 208 from the rest of the network. Thus, IC 208 functions nominally in a 5 volt network. The components and operating modes of the present embodiment of the high voltage tolerant IO circuit are described in greater detail below.

Figure 3A:
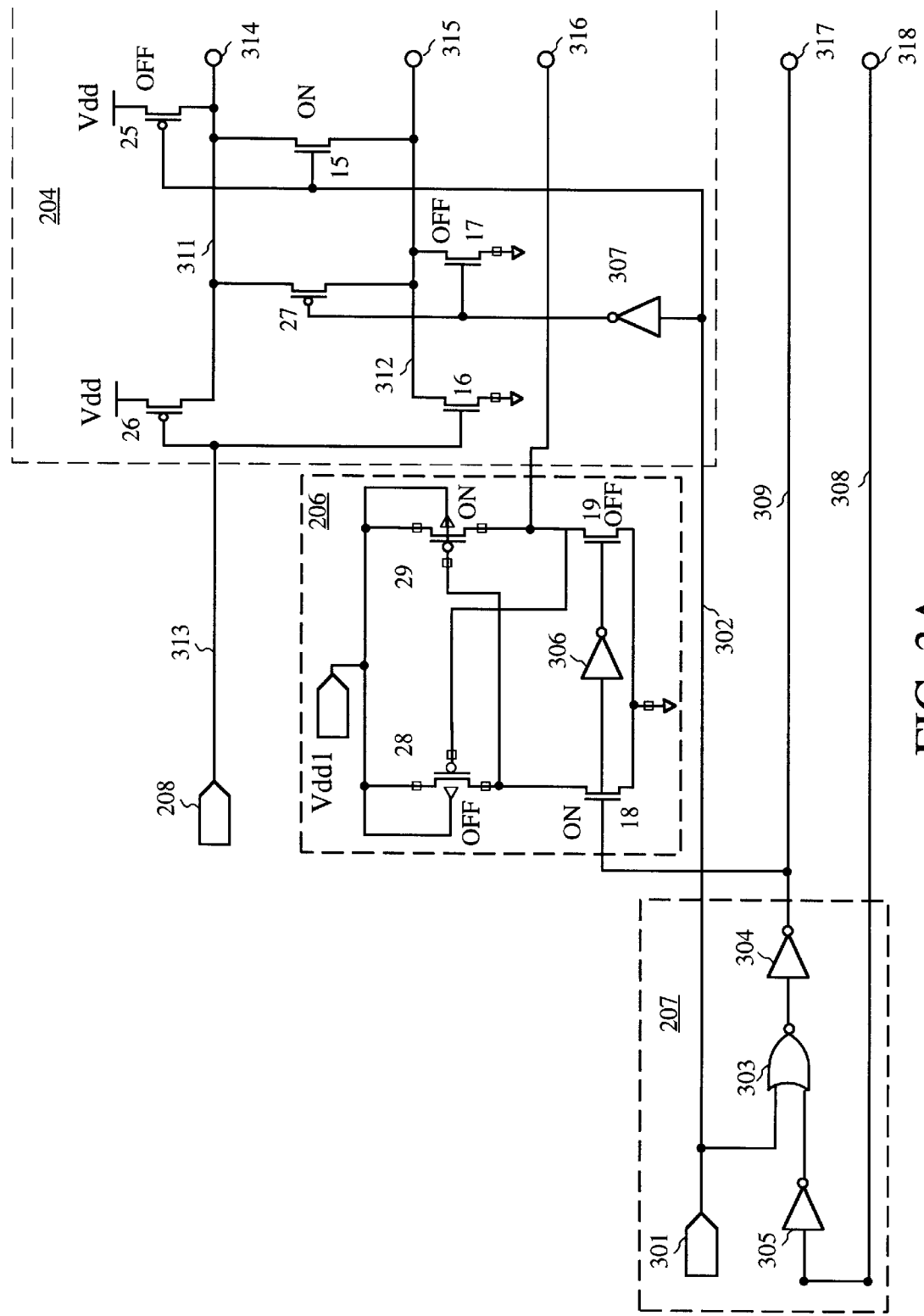
FIG. 3A shows the first stage circuit, level shifter circuit, and control signal circuit of the high voltage tolerant input/output circuit of the present invention in active mode steady state.
Figure 3B:
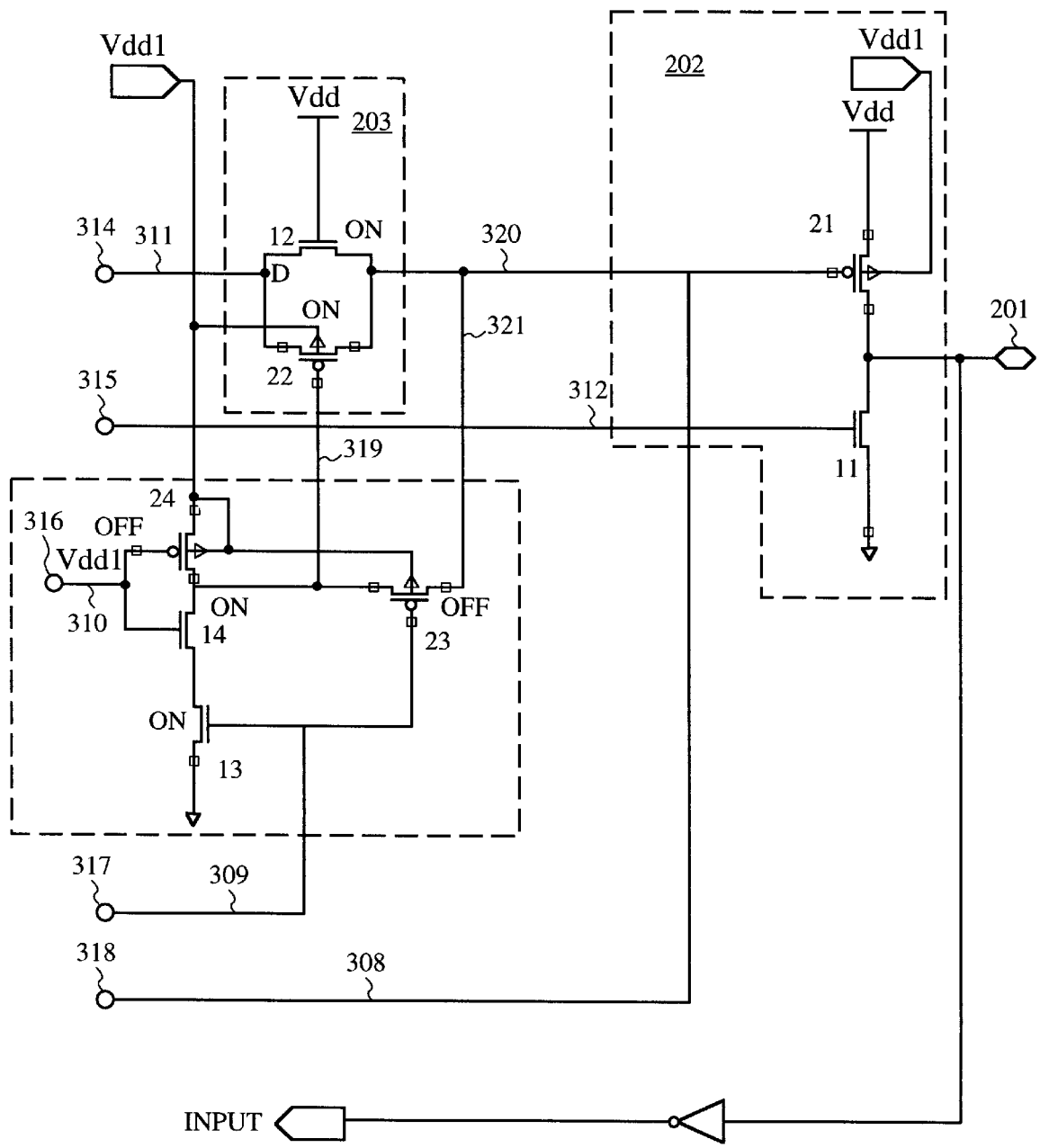
FIG. 3B shows the second stage circuit, charger circuit, and isolator circuit of the high voltage tolerant input/output circuit of the present invention in active mode steady state.

Detailed description of the components and operating modes of the present invention FIGS. 3A and 3B show a schematic diagram of the high voltage tolerant IO circuit 50 of the present invention in the active mode steady state. FIG. 3A shows the control circuit 207, the level shifter 206, and the first stage 204, of the present invention, whereas FIG. 3B shows the isolation circuit 203, the second stage 202, and the charger circuit 205.

Referring to FIG. 3A, the control circuit 207 is coupled to the input pad 301, via line 302. When input pad 301 is at 3v, the circuit is in the active mode. Control circuit 207 includes a switching logic circuit comprising NOR gate 303 coupled to inverter 304 which is in turn coupled to a control signal line 309. Control circuit 207 also includes a high trip point (greater voltage than normal required to cause logical transition between 0 and 1) inverter 305 having its output terminal coupled to NOR gate 303 and having its input terminal coupled to a feedback signal line 308. In active mode, line 302 is at 3v, the output signal of inverter 304 is 3v, and the signal on control signal line 309 is 3v.

The level shifter circuit 206 is coupled to the control signal line 309 and a level shifter line 310. The purpose of the level shifter 206 is to shift the logic level of the control signal line 309 from 3v asserted high to 5v asserted high. When control signal line 309 is at 3v, level shifter 206 drives level shifter line 310 to Vdd1 (5v), with transistors 18 and 29 turned on, 19 and 28 turned off. When control signal line 309 is at low voltage (0v), the level shifter line 310 is also at low voltage (0v), with 19 and 28 turned on, 18 and 29 turned off.

The first stage circuit 204 is coupled to the line 302 via an inverter 307. The output terminal of inverter 307 is coupled to the gate of p-type transistor 27 and the gate of n-type transistor 17. Thus transistor 17 is off and transistor 27 is on, in the active mode. P-type transistor 27 is coupled between the first stage high data line 311 (hereafter data line 311) and the low data line 312 (hereafter data line 312). Transistor 17 is coupled between data line 312 and ground. P-type transistor 25 is off and n-type transistor 15 is on. Thus, the data line 312 and the data line 311 are electrically coupled. The output data signals are received across the output data line 313. The output data line 313 is coupled to an output logic circuit comprising the inverter formed by p-type transistor 26 and n-type transistor 16. In active mode, a high output data signal on line 313 turns on transistor 16, thereby pulling the voltage on data lines 312 and 311 to 0v. On the other hand, a low output data signal on lines 313 turns on transistor 26, thereby pulling the voltage on lines 311 and 312 to Vdd (3v). The four nodes, 314, 315, 316, 317, and 318 indicate the connection points between the schematic of FIG. 3A and FIG. 3B.

Referring to FIG. 3B, the isolation circuit 203 is coupled to the first stage 204 via the data line 311. The isolation circuit 203 includes a bilateral pass gate formed by a p-type transistor 22 and an n-type transistor 12. The gate of transistor 22 is coupled to the isolation interface line 319 and is at 0v during the active mode. The gate of transistor 12 is coupled to Vdd (3v). Thus, transistor 22 and transistor 12 are on and data line 311 is coupled to second stage high data line 320 (hereafter data line 320). In addition, the NWELL of p-type transistor 22 is coupled to Vdd1 (5v) in order to prevent latch up when second stage high data line 320 is at 5v during tristate mode. The same is true for p-type transistors, 28,29,23,24, and 21, which are all exposed to 5 volts at either their gate and/or source.

The second stage circuit 202 is coupled to the isolation circuit 203 via the data line 320 and the first stage 204 via the data line 312. In the active mode, transistors 22 and 12 are on, thus coupling data line 311 and data line 320. Transistors 15 and 27 are on, thus coupling the data line 320 and the data line 312. The data line 320 and the data line 312 are coupled to the gate of transistors 21 and 11 respectively, thereby coupling the inverter formed by p-type transistor 21 and n-type transistor 11 with the inverter formed by transistor 26 and transistor 16 in active mode. When high data line 320 and data line 312 are 0v, transistors 21 and 11 drive IO pad 201 to Vdd. When high data 320 and low data 312 are 3v, transistors 21 and 11 drive IO pad 201 to 0v. Thus, the output data signal on output data line 313 is driven onto IO pad 201. In addition, the NWELL of transistor 21 is coupled to Vdd1 to prevent latch up when IO pad 201 is at 5v during the tristate mode.

The charger circuit 205 of FIG. 3B is coupled to the isolation circuit 203 via an isolation interface line 319, and to the second stage 202 via a conditioning line 321. During the active mode, the charger circuit 205 ensures that voltage Vdd1 (5v) is not provided on the data line 320. This is primarily accomplished by p-type transistor 23. The gate of transistor 23 is coupled to control signal line 309 and is at 3v during the active mode. This level switches transistor 23 off and decouples data line 320 from the rest of the charger circuit 205. Level shifter line 310 is coupled to the gates of the inverter formed by p-type transistor 24 and n-type transistor 14. In the active mode, level shifter line 310 is at 5v, switching on transistor 14 and off transistor 24. The isolation interface line 319 is thus at 0v since transistor 13 is on (gate at 3v from control signal line 309). The NWELL of transistor 24 and transistor 23 are both coupled to Vdd1 to prevent latch up. The level shifter line 310 must be at 5v (coupling 5v to the gate of p-type transistor 24) to prevent shorting Vdd1 to ground. If the gate of transistor 24 is less than 4.4v (Vdd1-Vt, where Vt is threshold voltage), transistor 24 will turn on and flow current via transistor 14 and transistor 13 to ground.

Figure 4A:
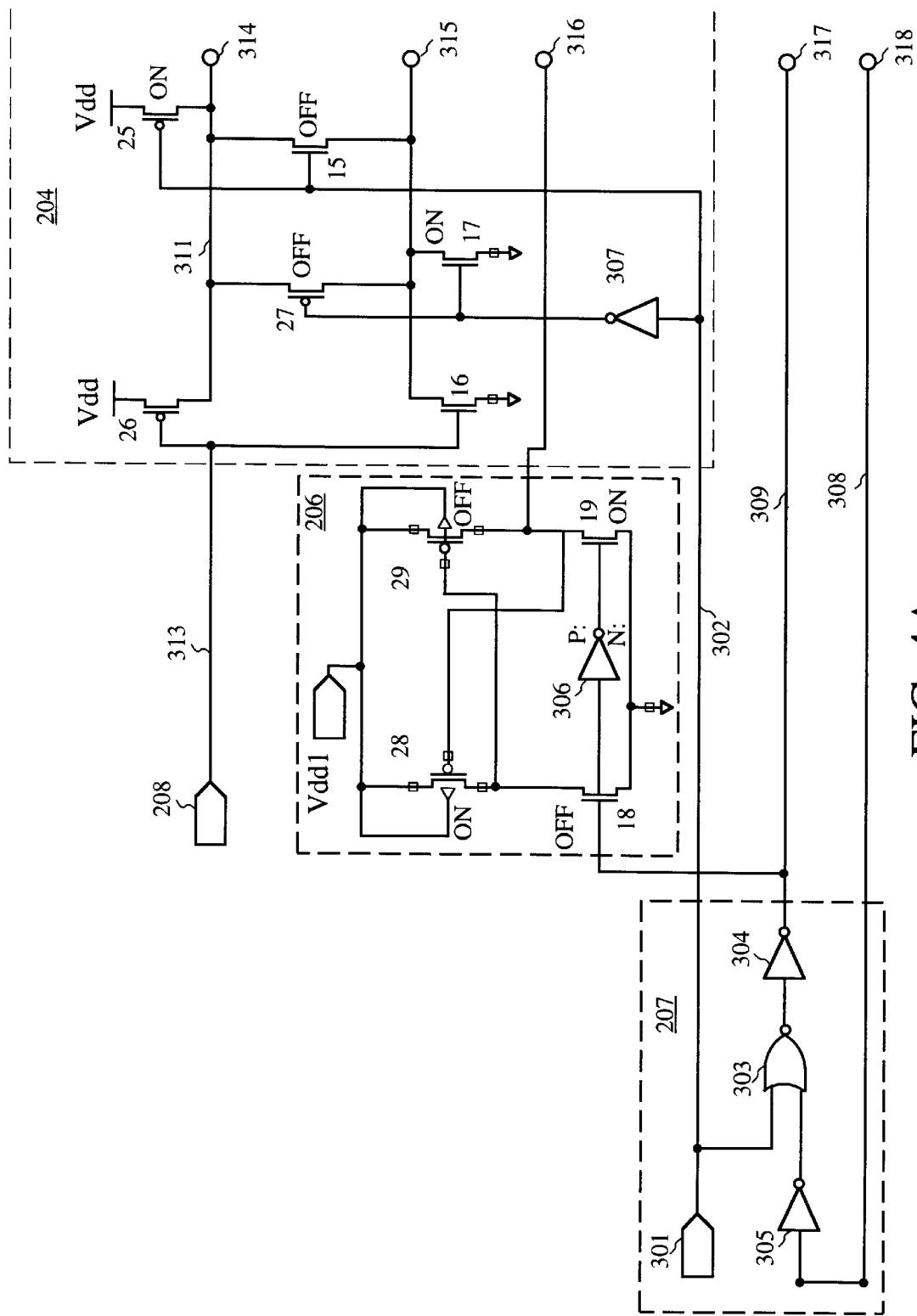
FIG. 4A shows the first stage circuit, level shifter circuit, and control signal circuit of the present invention in tristate mode steady state.
Figure 4B:
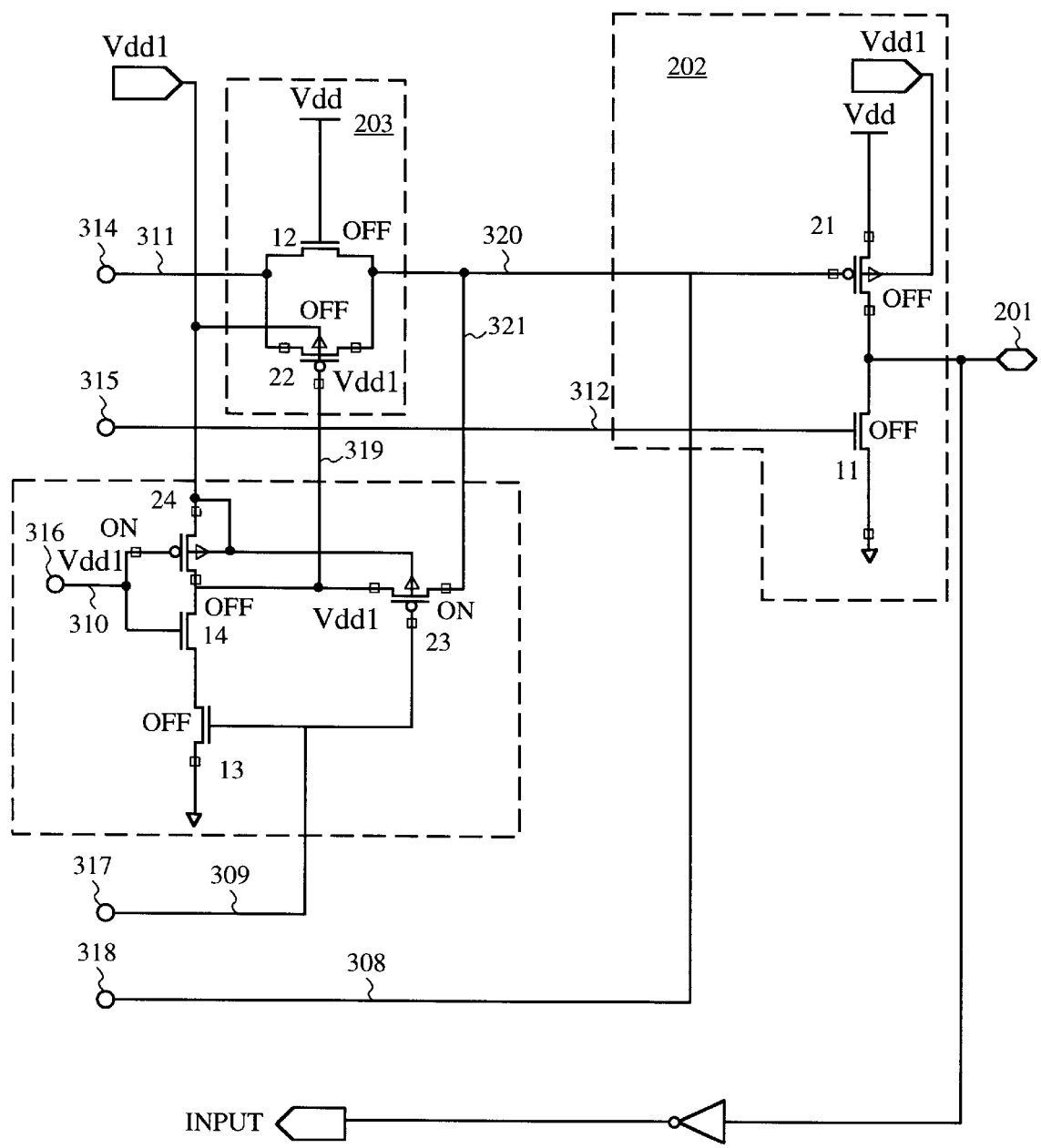
FIG. 4B shows the second stage circuit, charger circuit, and isolator circuit of the present invention in tristate mode steady state.

Referring now to FIG. 4A and FIG. 4B, a schematic diagram of the high voltage tolerant IO circuit 50 of the present invention is shown for the tristate mode steady state. In tristate mode, the IO circuit 50 is not actively outputting data. IO pad 201 is switched to a high impedance state while other 5 volt elements (not shown) drive data onto the data bus (not shown). FIG. 4A shows the control circuit 207, the level shifter 206, and the first stage 204, of the present invention.

Referring to FIG. 4A, the control circuit 207 of FIG. 4A initiates tristate mode by line 302 and maintains this mode once steady state is reached. In the tristate mode, 0 volts is provided on the line 302. The output voltage of inverter 305 is zero because feed back line 308 is at 5v. Thus, the output of inverter 304 will be 0v and the control signal line 309 is at 0v. The control circuit 207 outputs 0v on the line 302 and 0v on the control signal line 309.

The level shifter circuit 206, as described above, is coupled to the control signal line 309 and a level shifter line 310. When control signal line 309 is at 0v, level shifter 206 pulls down level shifter line 310 to 0v. Thus, level shifter line 310 is at 0v during the tristate mode.

The first stage circuit 204 i s coupled to the line 307 via the input of inverter 307. Thus, in the tristate mode, the output of inverter 307 is 3v, transistor 27 is off, transistor 17 is on, transistor 25 is on, and transistor 15 is off. This decouples the data line 311 and the data line 312, and drives the data line to 3v. The data line 312 is pulled down to 0v by transistor 17.

Referring now to FIG. 4B, the remaining portion of the schematic diagram of the high voltage tolerant IO circuit 50 of the present invention is shown. As in FIG. 4A, FIG. 4B shows the circuit in the tristate mode steady state. FIG. 4B shows the isolation circuit 203, the charger 205, and the second stage 202 of the present invention. The isolation circuit 203, as described above, is coupled to the first stage 204 via the data line 311. The isolation circuit 203 must isolate the 5v on the data line 320 from the data line 311. In the tristate mode, the isolation interface line 319 is charged to 5v by the charger circuit 205, coupling 5v to the gate of p-type transistor 22. This configuration turns off transistor 22. The data line 320 is at 5v. There is no back flow current, however, because the gate of transistor 22 is also at 5v. The NWELL of transistor 22 is coupled to Vdd1 so there is no latch up problem. The gate of transistor 12 is at Vdd. With the data line 320 at 5v, transistor 12 is also off. Thus, the data line 311 is isolated from the data line 320 in tristate mode.

The charger circuit 205 is coupled to the isolation circuit 203 via the isolation interface line 319, and is coupled to the second stage 202 via a conditioning line 321. During the tristate mode, the charger 205 charges the isolation interface line 319 and the data line 320 to Vdd1 in order to effectively protect the circuit from the 5 volts on IO pad 201. In the tristate mode, control signal line 309 is 0v. This configuration turns off transistor 13 and turns on transistor 23. The level shifter line 310 is at 0v. This configuration turns on p-type transistor 24 and turns off n-type transistor 14. Thus, Vdd1 is coupled via transistor 24, via transistor 23, and onto conditioning line 321. This configuration charges data line 320 to 5v. The NWELL of transistor 24 and transistor 23 are both coupled to Vdd1 to prevent latch up.

The second stage circuit 202 of FIG. 4B is coupled to the charger circuit 205 via the conditioning line 321. During the tristate mode, the charger 205 drives conditioning line 321 to 5v. This configuration charges data line 320 to 5v. The data line is at 0v, as described above. This configuration turns off p-type transistor 21 and n-type transistor 11. Thus, with transistor 21 and transistor 11 off, IO pad 201 is isolated with very high impedance. The gate of transistor 21 is at 5v to prevent back flow current from IO pad 201. The NWELL of transistor 21 is at 5v to prevent latch up.

Transition from output to tristate mode

Figure 5:
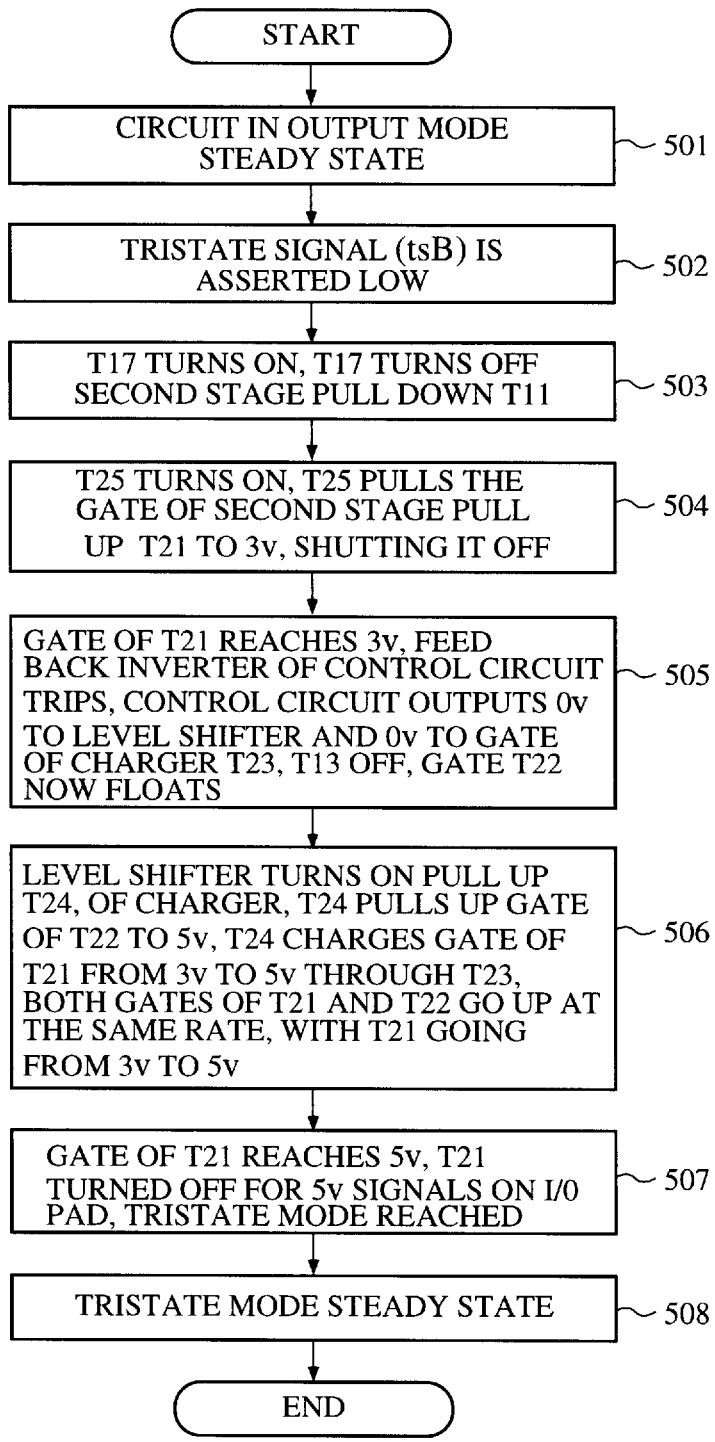
FIG. 5 shows a flow chart of the steps involved in the transition from active mode to tristate mode of the present invention.

Referring now to FIG. 5, a flow chart is shown of the steps involved in the transition process 500 from active mode to tristate mode, in the present embodiment of the high voltage tolerant IO circuit 50. At step 501, the initial state of the circuit 50 is active mode steady state (FIG. 3A and FIG. 3B). At step 502, the tristate signal 302, tsB, is asserted low (0v). Transistor 17 turns on at step 503, and pulls down the data line 312 to 0v. This configuration turns off second stage transistor 11. First stage transistor 25 turns on and high voltage flows via transistors 12 and 22, pulls up the gate of second stage transistor 21 to Vdd (3v) at step 504. When the gate of transistor 21 reaches 3v, feed back line 308 couples 3v to high trip inverter 305. The inverter 305 trips to output a logical 0 (0v), thus, causing control signal line 309 to charge to 3v. The control signal line 309 couples 0v to the level shifter 206 and the gate of transistor 23 at step 505. The level shifter 206 turns on transistor 24. Transistor 24 charges the gate of isolation circuit transistor 22 to 5v and charges data line 320, via transistor 23, from 3v to 5v at step 506. The gate of second stage transistor 21 reaches 5v and turns off transistor 21. Transistor 11 is off from step 503. The IO pad 201 is now tristated at step 507. The circuit of the present embodiment is now in tristate mode steady state at step 508.

Transition from tristate to active mode

Figure 6:
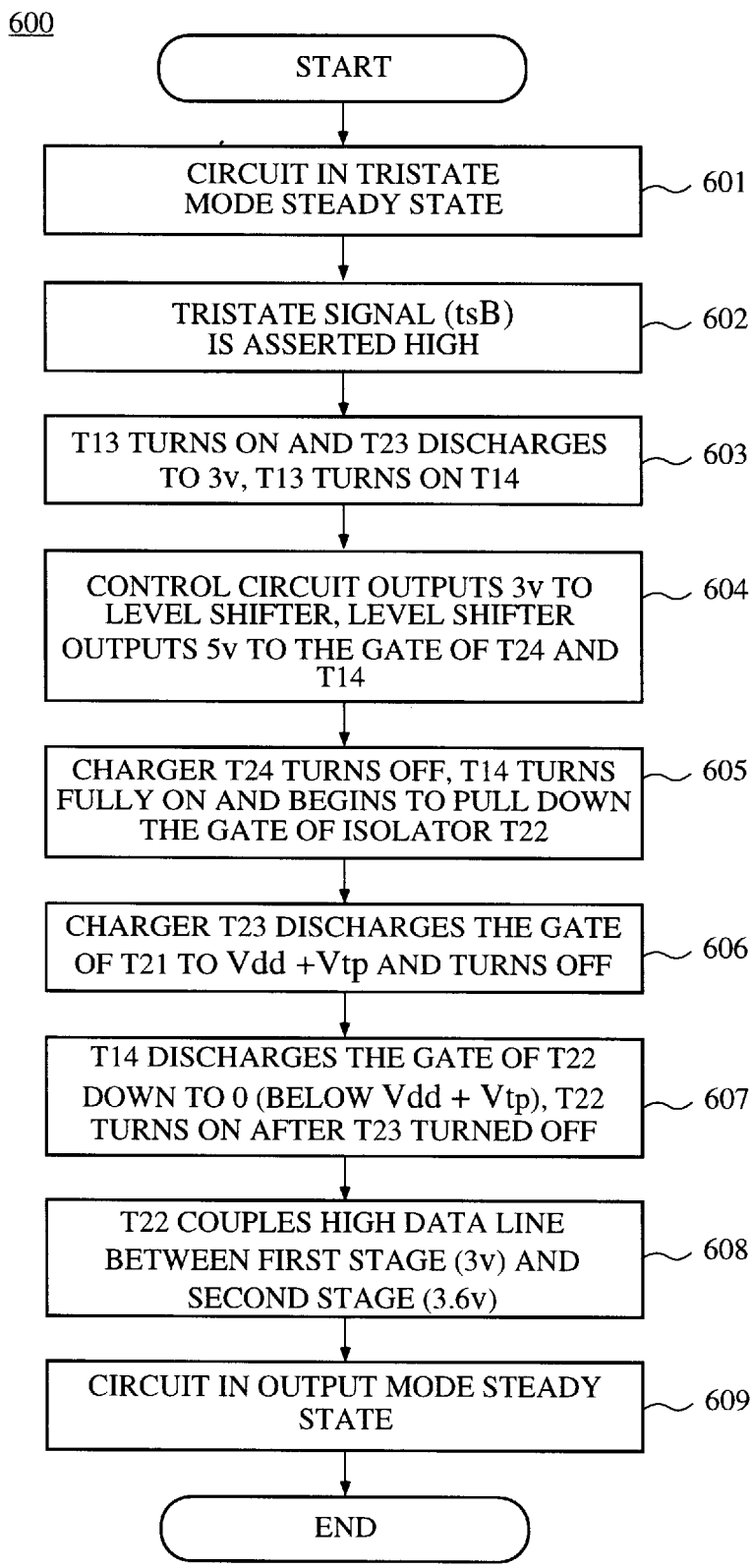
FIG. 6 shows a flow chart of the steps involved in the transition from tristate mode to active mode of the present invention.

Referring now to FIG. 6, a flow chart is shown of the steps involved in the transition 600 from tristate mode to active mode, in the present embodiment of the high voltage tolerant IO circuit 50. The initial state of the IO circuit is tristate mode steady state at step 601. The tristate signal 302 is asserted high (3v) at step 602. This configuration causes inverter 304 to output 3v onto control signal line 309. Charger circuit transistor 13 turns on and the gate of transistor 23 discharges to 3v and remains on, and level shifter 206 turns on transistor 14 at step 603. Level shifter 206 couples 5v to level shifter line 310. Level shifter line 310 couples 5v to the gate of charger transistor 14 and transistor 24 at step 604. Charger transistor 24 turns off, transistor 14 turns fully on, and begins to pull down the gate of isolator transistor 22 at step 605 from 5v to ground. Charger transistor 23 pulls down the gate of second stage transistor 21 from 5v to Vdd +Vtp (3.6v) at step 606 and then transistor 23 turns off. As transistor 14 and transistor 13 continue to pull down the gate of transistor 22, transistor 22 turns on when the voltage at the gate of transistor 22 decreases below Vgs =Vtp, or Vdd +Vtp at step 607 after transistor 23 is turned off. Transistor 22 is now on and couples data line 311 (at 3v) and data line 320 at step 608 allowing the data line 311 and data line 320 to "see" each other. The voltage in the data line 320 (3.6 volts) has thus been pulled down from 5v before transistor 22 turns on. This configuration prevents latch up in transistor 25, transistor 26, and transistor 27 due to charge sharing between the data line 311 and the data line 320. Latch up is prevented because the voltage over data line 320 was reduced from 5v to 3.6v before transistor 22 was turned on. Transistor 12 (n-type) will not turn on until Vgs is greater than 0.6v (until data line is at Vdd −0.6). Transistor 22 is fully on, transistor 23 and transistor 24 are fully off, and the circuit is now in active mode steady state at step 609.

Figure 7A:
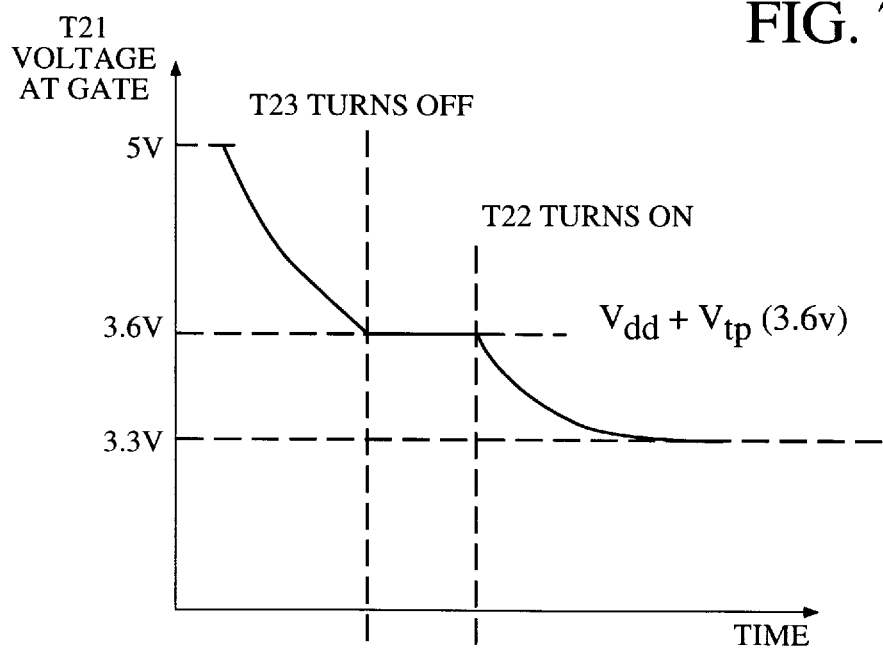
FIG. 7A shows a graph of the voltage at the gate of transistor number 21 of the circuit of the present invention during transition from tristate mode to active mode.
Figure 7B:
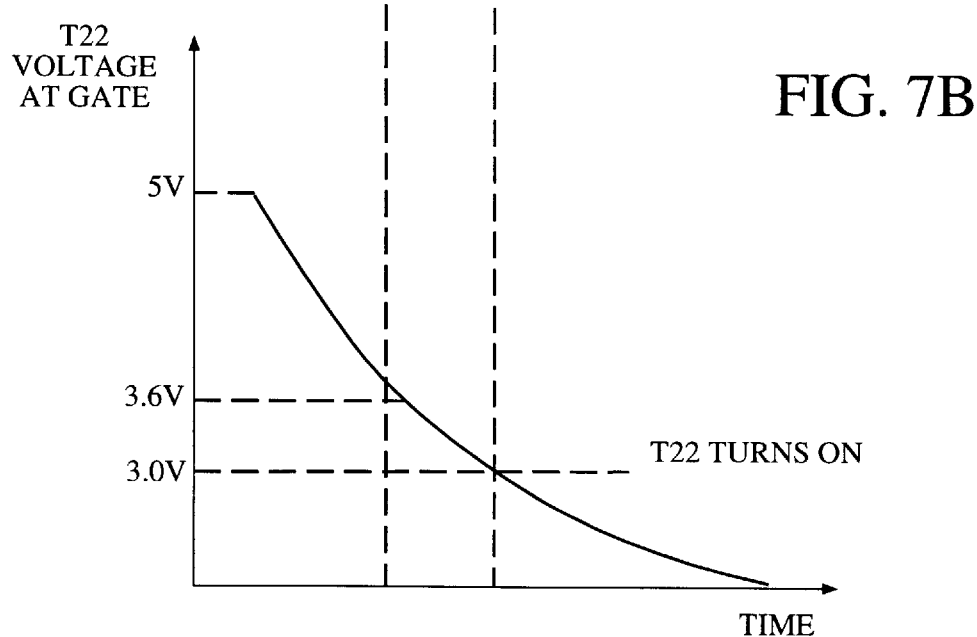
FIG. 7B shows a graph of the voltage at the gate of transistor number 22 of the circuit of the present invention during transition from tristate mode to active mode.

Referring now to FIG. 7A and FIG. 7B, the voltage at the gate of transistor 21 and the voltage at the gate of transistor 22 are graphed to show the relationship between charger circuit transistor 23 and isolation circuit transistor 22 during the transition from tristate mode to active mode. In FIG. 7A, the voltage at the gate of transistor 21 is shown over time during the transition. As described above, the voltage at the gate of transistor 21 is pulled down by transistor 14 via transistor 23. The gate of transistor 23 is at Vdd (3v). Transistor 23 stays on as long as Vgs is less than Vtp (−0.6v). Thus, transistor 23 turns off when the voltage at the gate of transistor 21 reaches Vdd +0.6v =3.6v. Transistor 21 gate voltage thus remains at Vdd +Vtp until transistor 22 turns on.

In FIG. 7B, the voltage at the gate of transistor 22 is shown. Transistor 22 gate voltage is steadily pulled down by transistor 14. Transistor 22 turns on at Vgs ≦Vtp where Vtp =−0.6v. Thus, transistor 22 turns on when Vdd +Vtp =3.0v. This occurs after transistor 23 turns off. When transistor 22 turns on, the voltage at the gate of transistor 21 is coupled with the voltage on the data line 311. As transistor 22 is turned fully on, the IO circuit of the present invention is in the active mode steady state.

The preferred embodiment of the present invention, a high voltage tolerant input/output circuit structure, is thus described. While the present invention has been described in particular embodiments, it should be appreciated that the present invention should not be construed as limited by such embodiments, but rather construed according to the below claims.

What is claimed is:

1. An output driver circuit comprising:
   a first stage operating at a medium voltage;
   a second stage operating in a tristate mode and an active mode, the second stage comprising an active driver having a p-type pull-up transistor coupled to an input/output pad, wherein the input/output pad interfaces with a high voltage network;
   an isolator circuit coupled between the first stage and the second stage for programmable voltage isolation between the first stage and the second stage;
   a charger circuit, for maintaining a high voltage on a gate of the p-type pull-up transistor during the tristate mode and for decreasing the voltage on the gate of the p-type pull-up transistor in advance of a transition from the tristate mode to the active mode, to prevent back flow of current from the high voltage network to the second stage; and
   a controller circuit coupled to the first stage, the second stage, and the charger circuit, the controller circuit coordinating transitions between the active mode and the tristate mode, the controller circuit comprising a switching logic circuit for properly timing a transition signal during the transition from the active mode to the tristate mode.

2. The output driver circuit of claim 1 further comprising a level shifter circuit having an input coupled to the controller circuit and an output coupled to the charger circuit for generating a low voltage output upon a low voltage input and for generating a high voltage output upon a medium voltage input.

3. The output driver circuit of claim 2 wherein the first stage comprises:
   an output data line accepting an input data signal; and,
   an output logic circuit coupled to the output data line for receiving input data signals, the output logic circuit also coupled to both the isolator circuit and the second stage.

4. The output driver circuit of claim 3 wherein the second stage comprises:
   an I/O pad driver comprising:
   an n-type pull down transistor coupled to the input/output pad; and,
   the p-type pull-up transistor coupled to the input/output pad, wherein an NWELL of the p-type pull-up transistor is coupled to a high voltage power supply to prevent latch up;
   a high data line coupled between the isolator circuit and the gate of the p-type transistor, wherein the high data line carries signals of between the low voltage and the medium voltage during the active mode and is at 5 volts during the tristate mode; and,
   a low data line coupled between the output logic circuit and the gate of the n-type pull down transistor, wherein the low data line carries signals of between the low voltage and the medium voltage during the active mode and is at the low voltage during the tristate mode.

5. The output driver circuit of claim 4, wherein the charger circuit comprises:
   a level shifter line coupled to the level shifter, wherein the charger circuit accepts a signal from the level shifter to transition between the active mode and the tristate mode;
   a control signal line coupled to the controller circuit for receiving a transition signal for initiating the transition between the active mode and the tristate mode;
   a isolation interface line coupled to the isolator circuit for initiating isolation of the first stage and the second stage during transition between the active mode and the tristate mode;
   a conditioning line coupled to the high data line for switching the high data line of the second stage to either the active mode or the tristate mode; and,
   a p-type transistor coupled to the conditioning line for charging the high data line to the high voltage during the tristate mode and discharging the high data line to the medium voltage during the active mode.

6. The output driver circuit of claim 5, wherein the isolator circuit includes:
   an n-type transistor having a gate coupled to the medium voltage, a source coupled to the high data line of the second stage, and a drain coupled to the first stage; and,
   a p-type transistor having an NWELL coupled to the high voltage, a gate coupled to the isolation interface line, a source coupled to the source of the n-type transistor, and a drain coupled to a drain of the n-type transistor, wherein the isolator circuit prevents the low voltage on the first stage from coupling with the high voltage on the second stage when the high voltage is placed on the isolation interface line by the charger circuit.

7. An output driver circuit comprising:

a first stage operating at a medium voltage;

a second stage operating in a tristate mode and an active mode, the second stage comprising an output driver having a p-type pull-up transistor coupled to an input/output pad, wherein the input/output pad interfaces with a high voltage network operating between a low voltage and a high voltage;

an isolator circuit coupled between the first stage and the second stage for programmable voltage isolation between the first stage and the second stage during the tristate mode; and, a charger circuit, for maintaining the high voltage on a gate of the p-type pull-up transistor during the tristate mode, the charger having a transistor for reducing the voltage on the high data line to a value close to the medium voltage in advance of the isolator circuit coupling the first and second stages.

8. The output driver circuit of claim 7 further comprising a controller circuit coupled to the first stage, the second stage, and the charger circuit, the controller circuit coordinating transitions between the active mode and the tristate mode, the controller circuit comprising a switching logic circuit for properly timing a transition signal during the transition from the active mode to the tristate mode.

9. The output driver circuit of claim 7 further comprising a level shifter circuit having an input coupled to the controller circuit and an output coupled to the charger circuit for generating a low voltage output upon a low voltage input and for generating a high voltage output upon a medium voltage input.

10. The output driver circuit of claim 7 wherein the first stage comprises:

an output data line accepting an input data signal; and, an output logic circuit coupled to the output data line for receiving the input data signal, the output logic circuit coupled to both the isolator circuit and the second stage.

11. The output driver circuit of claim 10 wherein the second stage comprises:

an I/O pad driver comprising:

an n-type pull down transistor coupled to the input/output pad; and, the p-type pull-up transistor coupled to the input/output pad, wherein an NWELL of the p-type pull-up transistor is coupled to a high voltage power supply to prevent latch up;

a high data line coupled between the isolator circuit and the gate of the p-type transistor, wherein the high data line carries signals of between the low voltage and the medium voltage during the active mode and is at 5 volts during the tristate mode; and, a low data line coupled between the output logic circuit and the gate of the n-type pull down transistor, wherein the low data line carries signals of between the low voltage and the medium voltage during the active mode and is at the low voltage during the tristate mode.

12. The output driver circuit of claim 11, wherein the isolator circuit comprises:

an n-type transistor having a gate coupled to the medium voltage, a source coupled to the high data line of the second stage, and a drain coupled to the first stage; and, a p-type transistor having an NWELL coupled to the high voltage power supply, a gate coupled to an isolation interface line, a source coupled to the source of the n-type transistor, and a drain coupled to the drain of the n-type transistor, wherein the isolator circuit prevents the low voltage on the first stage from coupling with the high voltage on the second stage when the high voltage is placed on the isolation interface line by the charger circuit.

13. An output driver circuit comprising:

a first stage operating at a medium voltage;

a second stage operating in a tristate mode and an active mode, the second stage comprising an output driver having a p-type pull-up transistor coupled to an input/output pad, wherein the input/output pad interfaces with a high voltage network;

an isolator circuit coupled between the first stage and the second stage for voltage isolation between the first stage and the second stage during the tristate mode, the isolator circuit comprising:

an n-type transistor having a gate coupled to a medium voltage, a source coupled to a high data line of the second stage, and a drain coupled to the first stage; and a p-type transistor having an NWELL coupled to a high voltage, a gate coupled to an isolation interface line, a source coupled to the source of the n-type transistor, and a drain coupled to the drain of the n-type transistor, wherein the isolator circuit prevents the low voltage on the first stage from coupling with the high voltage on the second stage when the high voltage is placed on the isolation interface line;

a charger circuit, for maintaining the high voltage on a gate of the p-type pull-up transistor during the tristate mode and for maintaining the low voltage on the gate of the p-type pull-up transistor during the active mode, and for decreasing the voltage on the gate of the p-type pull-up transistor in advance of a transition from the tristate mode to the active mode to prevent back flow of current from the high voltage network to the second stage.

14. The output driver circuit of claim 13 further comprising a controller circuit coupled to the first stage, the second stage, and the charger circuit, the controller circuit coordinating transitions between the active mode and the tristate mode, the controller circuit comprising a switching logic circuit for properly timing a transition signal during the transition from the active mode to the tristate mode.

15. The output driver circuit of claim 14 further comprising a level shifter circuit having an input coupled to the controller circuit and an output coupled to the charger circuit for generating a low voltage output upon a low voltage input and for generating a high voltage output upon a medium voltage input.

16. The output driver circuit of claim 15 wherein the first stage comprises:

an output data line accepting an input data signal; and, an output logic circuit coupled to the output data line receiving input data signal, the output logic circuit coupled to both the isolator circuit and the second stage.

17. The output driver circuit of claim 16 wherein the second stage comprises:

an I/O pad driver comprising:

an n-type pull down transistor coupled to the input/output pad; and, the p-type pull-up transistor coupled to the input/output pad, wherein an NWELL of the p-type pull-up transistor is coupled to a high voltage power supply to prevent latch up;

a high data line coupled between the isolator circuit and the gate of the p-type transistor, wherein the high data line carries signals of between the low voltage and the medium voltage during the active mode and is at 5 volts during the tristate mode; and, a low data line coupled between the output logic circuit and the gate of the n-type pull down transistor, wherein the low data line carries signals of between the low voltage and the medium voltage during the active mode and is at the low voltage during the tristate mode.

18. The output driver circuit of claim 17, wherein the charger circuit further comprises a transistor for reducing the voltage on the high data line to a value close to the medium voltage in advance of the isolator circuit coupling the first and second stages.

* * * * *